United States Patent
Vashchenko et al.

(10) Patent No.: US 7,929,262 B1
(45) Date of Patent: Apr. 19, 2011

(54) METHOD AND STRUCTURE FOR AVOIDING HOT CARRIER DEGRADATION AND SOFT LEAKAGE DAMAGE TO ESD PROTECTION CIRCUIT

(75) Inventors: Vladislav Vashchenko, Fremont, CA (US); Peter Hopper, San Jose, CA (US); Ann Concannon, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/960,882

(22) Filed: Sep. 21, 2001

(51) Int. Cl.
*H02H 3/22* (2006.01)

(52) U.S. Cl. .......................... 361/56; 361/111

(58) Field of Classification Search ............. 361/56–58, 361/91.1, 91.2, 91.3, 111
See application file for complete search history.

(56) References Cited

U.S. PATENT DOCUMENTS

| | | | | |
|---|---|---|---|---|
| 5,500,546 A * | 3/1996 | Marum et al. | ................ | 257/358 |
| 5,528,188 A * | 6/1996 | Au et al. | ................ | 327/310 |
| 5,631,793 A * | 5/1997 | Ker et al. | ................ | 361/56 |
| 5,789,964 A * | 8/1998 | Voldman | ................ | 327/380 |
| 5,825,601 A * | 10/1998 | Statz et al. | ................ | 361/56 |
| 5,838,146 A * | 11/1998 | Singer | ................ | 323/270 |
| 5,946,177 A * | 8/1999 | Miller et al. | ................ | 361/56 |
| 5,959,820 A * | 9/1999 | Ker et al. | ................ | 361/111 |
| 5,978,192 A * | 11/1999 | Young et al. | ................ | 361/56 |
| 5,986,861 A * | 11/1999 | Pontarollo | ................ | 361/56 |
| 6,031,405 A * | 2/2000 | Yu | ................ | 327/313 |
| 6,072,682 A * | 6/2000 | Ravanelli et al. | ................ | 361/111 |
| 6,249,410 B1 * | 6/2001 | Ker et al. | ................ | 361/56 |
| 6,400,540 B1 * | 6/2002 | Chang | ................ | 361/56 |
| 6,462,601 B1 * | 10/2002 | Chang et al. | ................ | 327/313 |
| 6,618,230 B2 * | 9/2003 | Liu et al. | ................ | 361/56 |
| 6,671,153 B1 * | 12/2003 | Ker et al. | ................ | 361/111 |
| 6,690,561 B2 * | 2/2004 | Hung et al. | ................ | 361/111 |
| 2002/0089017 A1 * | 7/2002 | Lai et al. | ................ | 257/355 |
| 2002/0186517 A1 * | 12/2002 | Liu et al. | ................ | 361/56 |
| 2003/0026054 A1 * | 2/2003 | Hulfachor et al. | ................ | 361/111 |

* cited by examiner

*Primary Examiner* — Danny Nguyen
(74) *Attorney, Agent, or Firm* — Jurgen K. Vollrath; Vollrath & Associates

(57) ABSTRACT

In a ESD protection device, hot carrier degradation and soft leakage are reduced by introducing a dynamic driver that includes a RC circuit for keeping the triggering circuit of the ESD device in an on-state for a certain period of time. This allows the current through the ESD protection device to be reduced during the RC delay time.

7 Claims, 2 Drawing Sheets

US 7,929,262 B1

METHOD AND STRUCTURE FOR AVOIDING HOT CARRIER DEGRADATION AND SOFT LEAKAGE DAMAGE TO ESD PROTECTION CIRCUIT

FIELD OF THE INVENTION

The invention relates to ESD protection devices and their protection against hot carrier degradation.

BACKGROUND OF THE INVENTION

In order to avoid damage to electronic circuits during electrostatic discharge (ESD) protection circuits have been devised to shunt current to ground and limit exposure to excessive voltages. A variety of devices have been developed including grounded gate NMOS, LVTSCR, and BJT triggering clamps. BJTs typically rely on avalanche breakdown and may be enhanced through the use of zener diodes to trigger the base of the BJT. These triggering clamps typically have relatively small dimensions with an active device width of 100-500 mm. However, they typically have high-triggering voltage levels and display breakdown characteristics that are process sensitive and in most cases, result in degradation, especially after exposure to multiple ESD pulses.

Normal operation mode clamps such as Merrill clamps are also known. These differ from triggering clamps insofar as they do not rely on avalanche injection conductivity modulation, but instead make use of a driver to be switched on. These CMOS normal operating mode clamps display large dimensions of the order of 10-20 mm since they have to deal with normal operating conditions where the current density is much lower. They find use in power devices, involving a whole chip design approach with rail protection strategies and wide metal buses where the increase in size due to the space consuming devices is less significant. On the other hand, they have the benefit of displaying excellent ESD protection characteristics.

A particular problem experienced by triggering clamps is so-called hot carrier degradation (HCD) and soft leakage. HCD has been ascribed to post-ESD stress caused by residual high voltage levels after triggering off. These residual high voltage levels approximately equal the triggering or breakdown voltage of the triggering structure. In the case of low leakage circuits, these voltage levels may be stored for a long time thereby causing long term overload, causing HCD of the gate oxide.

Examples of the prior art triggering clamps are illustrated in FIGS. 1-4 where FIG. 1 shows a grounded gate NMOS (GGNMOS) device 10 in which the gate is connected to ground via a resistor 12. FIG. 2 makes use of a low voltage triggering silicon controlled rectifier (LVTSCR) 20. FIG. 3 shows the use of a NPN BJT 30 that makes use of avalanche breakdown to provide ESD protection. FIG. 4 also makes use of an NPN transistor 40, but is supplemented with a zener diode 42 which feeds base current into the NPN transistor 40. All of these triggering circuits make use of snapback characteristics of the devices.

The present invention seeks to address the problem of HCD and soft leakage increase displayed by triggering clamps due to multiple ESD spikes.

SUMMARY OF THE INVENTION

According to the present invention, a dynamic driver is introduced to hold the controlling electrode of the triggering device in its on-state for a defined period of time by virtue of an RC circuit.

Further, according to the invention, there is provided a method of reducing hot carrier degradation in an ESD protection circuit, comprising the use of a dynamic driver in conjunction with a triggering clamp. The triggering clamp may be a GGNMOS, LVTSCR, or BJT device. Typically the dynamic driver includes a RC circuit. Thus the reduction in HCD is achieved by decreasing the current during an RC delay time.

Further, according to the invention there is provided a method of achieving early triggering in a triggering ESD protection device, comprising providing a RC circuit connected to a controlling electrode of the triggering device. This reduces the triggering voltage, thus providing early triggering.

DETAILED DESCRIPTION OF THE INVENTION

Figures 1, 2, 3, 4:
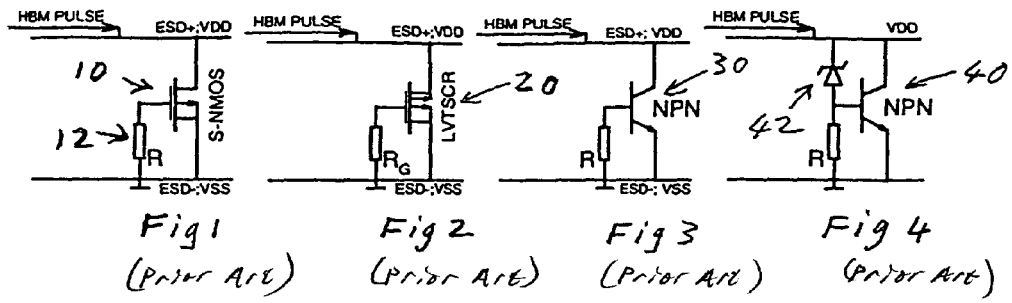
FIGS. 1-4 are schematic circuit diagrams of prior art triggering clamps.
Figures 5, 6, 7:
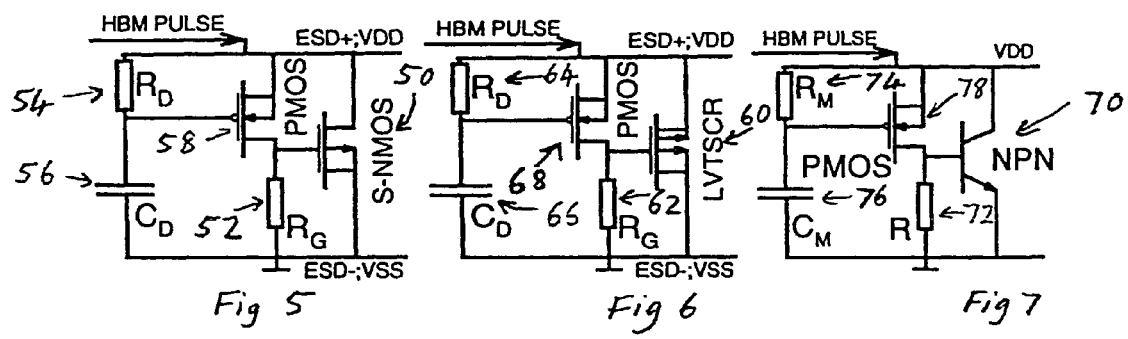
FIG. 5 is a schematic circuit diagram of one embodiment of the invention.
FIG. 6 is a schematic circuit diagram of another embodiment of the invention.
FIG. 7 is a schematic circuit diagram of yet another embodiment of the invention.
Figure 11:
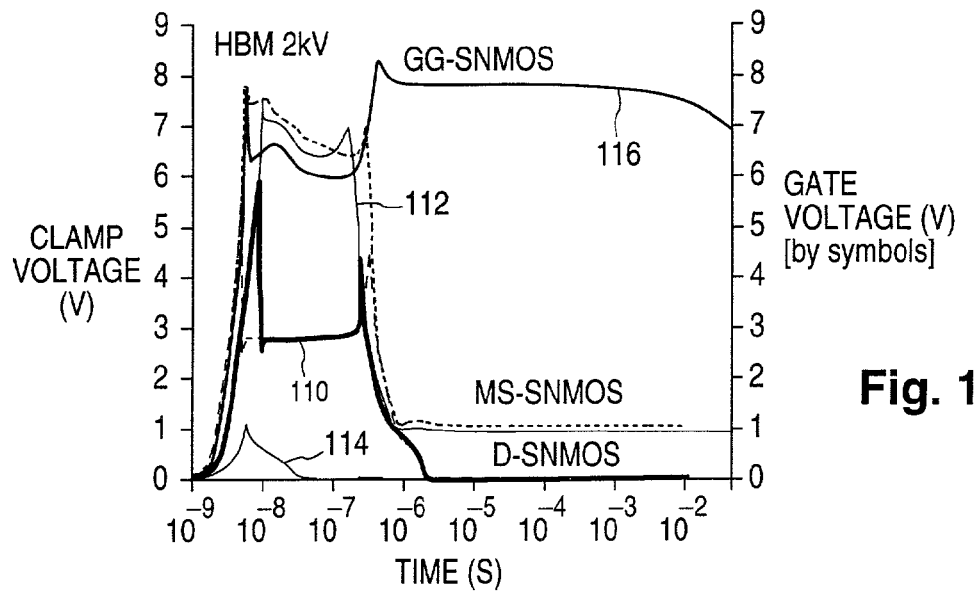
FIG. 11 shows voltage curves for a NMOS device used in accordance with the invention.

FIG. 5 shows one implementation of the invention, in which a NMOS device 50 is connected between $V_{dd}$ and $V_{SS}$ and has its gate connected to ground through a resistor 52. The NMOS device 50 serves as the triggering circuit, the controlling electrode of which is held in an on-state during a RC time defined by a driver circuit that includes a resistor 54 and a capacitor 56. The NMOS device 50 is connected to the RC circuit through a PMOS device 58 and the resistor 52. Initially, the dynamic driver presents an essentially discharged capacitor 56. The resistor 54 and capacitor 56 are chosen to provide a delay time that is greater than the duration of a ESD pulse. During the voltage increase of the ESD pulse, the triggering structure remains in an open channel state. This results in early triggering since the triggering voltage is decreased due to the increase of the gate bias. Notwithstanding this benefit of a decreased triggering voltage, the operating characteristics of the circuit remain substantially unaffected. The triggering structure of the invention provides similar operation to a conventional circuit during the major part of the ESD stress (approximately 150 ns). In addition, the present invention provides for a current decrease at the back end of the ESD pulse, as dictated by the RC delay time of the driver circuit of the invention. This causes the current gradually to decrease down to the triggering off condition. However, the triggering structure (NMOS device 50) initially remains in a conductive state, thus discharging the rest of the ESD pulse during the RC delay time. This is illustrated in FIG. 11 by curves 110 and 112. Curve 110 shows the gate voltage while curve 112 shows the voltage across the clamp (the voltage across the drain and source of the NMOS device 50.)

Figure 12:
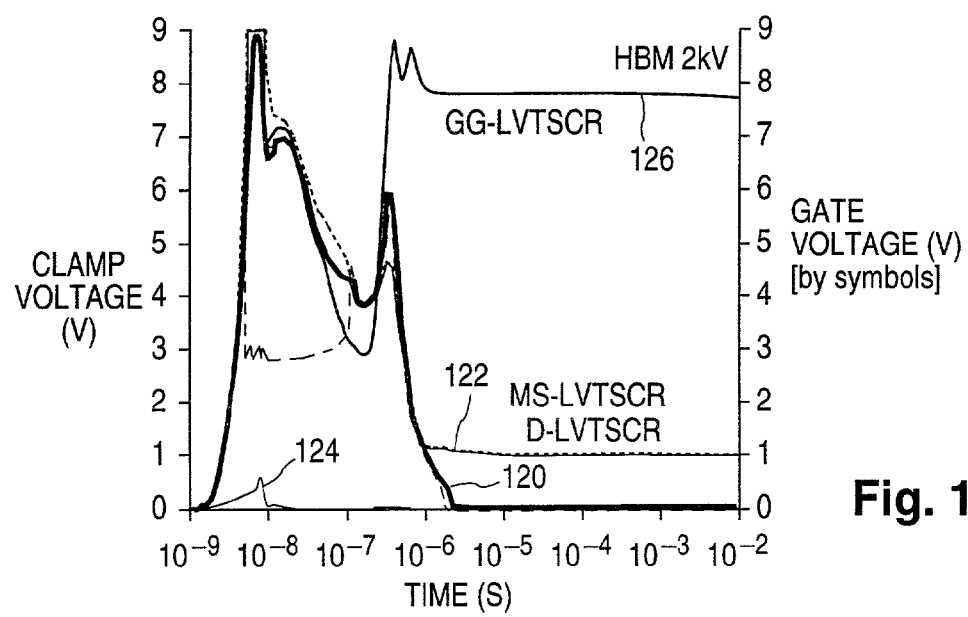
FIG. 12 shows voltage curves for a LVTSCR used in accordance with the invention.

FIG. 6 shows another implementation of the invention in which a LVTSCR 60 is connected to the driver circuit, which includes an RC circuit (comprising a resistor 64 and a capacitor 66) connected to a PMOS device 68. The output of the PMOS device 68 is connected to the gate of the LVTSCR 60 and to ground through a resistor 62. The gate voltage curve 120 and clamp voltage curve 122 are shown in FIG. 12 for the embodiment of FIG. 6.

Figure 13:
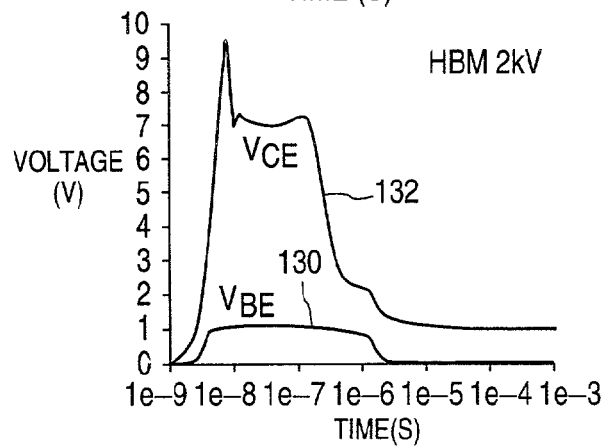
FIG. 13 shows voltage curves for a BJT used in accordance with the invention.

Yet another embodiment of the invention is illustrated in FIG. 7 in which the triggering device is a BJT in the form of a NPN transistor 70. The driver circuit is similar to those in the embodiments of FIGS. 5 and 6, and comprises a RC circuit consisting of a resistor 74 and the capacitor 76. These are connected to the gate of a PMOS device 78, the output of which is connected through a resistor 72 to ground and to the base of the NPN transistor 70. FIG. 13 shows the base voltage curve 130 and the clamp voltage 132 for the device illustrated in FIG. 7.

Figures 8, 9, 10:
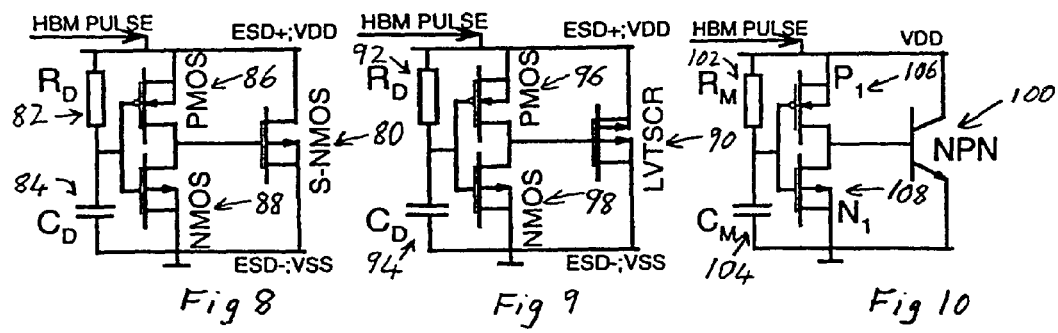
FIG. 8 is a schematic circuit diagram of yet another embodiment of the invention.
FIG. 9 is a schematic circuit diagram of yet another embodiment of the invention.
FIG. 10 is a schematic circuit diagram of yet another embodiment of the invention.

FIGS. 8, 9, and 10 illustrate further embodiments of the invention in which clamp inverters are used for triggering the snapback circuits. While the FIG. 8 embodiment may appear similar to a Merrill clamp when represented as a schematic, it is structurally and functionally quite different. The triggering device 80 is a snapback NMOS device which is 10-100 times smaller than a normally operating NMOS device used in a Merrill clamp. Due to the fact that bipolar avalanche-injection conductivity modulation is involved in the snapback device of the present invention, a device of 100-400 um size, instead of 10-20 mm, is achieved. In FIG. 9 the snapback circuit is a LVTSCR 90, and in FIG. 10 the snapback circuit is a BJT in the form of a NPN transistor 100. The RC circuits comprise resistors 82, 92, 102 and capacitors 84, 94, 104. The inverter comprises a PMOS-NMOS pair comprising PMOS transistors 86, 96, 106 and NMOS transistors 88, 98, 108.

The effect of the dynamic driver of the present invention, is to provide residual conductivity of the protection structure, whether that be a GGNMOS, a LVTSCR, or an enhanced zener bi-polar clamp, thereby discharging the circuit capacitance below the residual voltage after triggering off once the ESD pulse has passed.

The effect of this is shown in the curves of FIGS. 11, 12 and 13. The prior art curves 114, 124 for the voltage across the gate of a conventional clamp goes down to zero volt very quickly, thus preventing discharge of the rest of the ESD pulse during the total RC delay time. This is evident from the large voltages across the clamp as indicated by the curves 116, 126 after long delay times. In contrast, curves 110, 120, 130 remain above zero V for substantial periods of time, thereby keeping the triggering structure in conduction as indicated by the clamp voltage (curves 112, 122, 132) for the dynamic structure of FIGS. 5, 6, and 7, respectively, and curves 118, 128 for the structures of FIGS. 8 and 9, respectively.

It will be appreciated that the embodiments illustrated in FIGS. 5-10 are by way of example only. Different triggering clamps can be used with different dynamic drivers that have the effect of holding the triggering electrode of the triggering clamp in an on-state for an extended period of time.

What is claimed is:

1. An ESD protection structure, comprising
   an LVTSCR triggering device that is connected between a power supply rail and ground, and that has a controlling electrode, and
   an RC circuit for holding the controlling electrode of the LVTSCR triggering device in its on-state for between 10 μs and over 1 μs in order to reduce hot carrier degradation.

2. A structure of claim 1, wherein the controlling electrode of the LVTSCR is held in an on-state by a dynamic driver circuit, which holds the LVTSCR triggering device in its on state for a long enough period to dissipate current at the back end of the ESD pulse.

3. A structure of claim 2, wherein the dynamic driver comprises the RC circuit.

4. A method of reducing hot carrier degradation due to charge retention in an LVTSCR during an ESD pulse, wherein the LVTSCR is connected between a power supply rail and ground, and includes a controlling electrode, comprising
   providing an RC circuit for maintaining the LVTSCR in an on state for between 10 μs and over 1 μs by controlling the voltage on the controlling electrode, to allow discharging of the charge from the ESD pulse over the full ESD pulse duration to reduce hot carrier degradation.

5. A method of claim 4, wherein the RC circuit maintains the LVTSCR in its on state for a long enough period to dissipate current at the back end of the ESD pulse.

6. A method of reducing hot carrier degradation in an LVTSCR due to accumulated charge in the LVTSCR caused by an ESD pulse, wherein the LVTSCR is connected between a power rail and ground, comprising
   holding a controlling electrode of the LVTSCR in an on-state for between 10 μs and over 1 μs to allow substantially all of the accumulated charge from the ESD pulse to be dissipated to the ground to avoid hot carrier degradation.

7. A method of claim 6, wherein the holding electrode is held in an on-state for a period sufficient to dissipate current at the back end of the ESD pulse.

* * * * *